(12) United States Patent
Chen

(10) Patent No.: US 11,329,246 B2
(45) Date of Patent: May 10, 2022

(54) ORGANIC LIGHT EMITTING DIODE PANEL AND METHOD FOR FABRICATING SAME

(71) Applicant: SHENZHEN CHINA STAR OPTOELECTRONICS SEMICONDUCTOR DISPLAY TECHNOLOGY CO., LTD., Shenzhen (CN)

(72) Inventor: Jinxiang Chen, Shenzhen (CN)

(*) Notice: Subject to any disclaimer, the term of this patent is extended or adjusted under 35 U.S.C. 154(b) by 269 days.

(21) Appl. No.: 16/625,772

(22) PCT Filed: Nov. 22, 2019

(86) PCT No.: PCT/CN2019/120094
§ 371 (c)(1),
(2) Date: Dec. 23, 2019

(87) PCT Pub. No.: WO2021/088141
PCT Pub. Date: May 14, 2021

(65) Prior Publication Data
US 2021/0351373 A1 Nov. 11, 2021

(30) Foreign Application Priority Data
Nov. 8, 2019 (CN) .......................... 201911086216.3

(51) Int. Cl.
*H01L 51/52* (2006.01)
*H01L 51/00* (2006.01)
(Continued)

(52) U.S. Cl.
CPC ...... *H01L 51/5228* (2013.01); *H01L 51/0072* (2013.01); *H01L 51/5072* (2013.01);
(Continued)

(58) Field of Classification Search
CPC ............. H01L 51/5228; H01L 51/5072; H01L 51/5234; H01L 51/56; H01L 51/0007;
(Continued)

(56) References Cited

U.S. PATENT DOCUMENTS 7,642,109 B2   1/2010   Winters et al.
2009/0159906 A1   6/2009   Ishiguro
(Continued)

FOREIGN PATENT DOCUMENTS

CN   103918098 A   7/2014
CN   109860232 A   6/2019
(Continued)

*Primary Examiner* — Quoc D Hoang

(57) ABSTRACT

An organic light emitting diode panel and a fabrication method thereof are provided. The organic light emitting diode panel includes a substrate; a pixel defining layer disposed over a portion of the substrate; an organic light emitting diode device and an auxiliary cathode contacting device disposed over the substrate, wherein the organic light emitting diode device includes an anode layer, a hole injecting layer, a hole transporting layer, a light emitting layer, and an electron transporting layer sequentially formed over a portion of the substrate, and the auxiliary cathode contacting device includes an auxiliary cathode and a conductive contact sequentially formed over another portion of the substrate; a conductive contact, including a conductive mixture consisting of the electron transporting layer and a solvent material used to dissolve the electron transporting layer; and a transparent electrode layer, covering the electron transporting layer, the pixel defining layer, and the conductive contact.

9 Claims, 4 Drawing Sheets

(51) Int. Cl.
*H01L 51/50* (2006.01)
*H01L 51/56* (2006.01)
*H01L 27/32* (2006.01)

(52) U.S. Cl.
CPC .......... *H01L 51/5234* (2013.01); *H01L 51/56* (2013.01); *H01L 27/3246* (2013.01); *H01L 27/3283* (2013.01); *H01L 51/0007* (2013.01); *H01L 2227/323* (2013.01); *H01L 2251/308* (2013.01)

(58) Field of Classification Search
CPC ............. H01L 27/3246; H01L 27/3283; H01L 27/3244; H01L 2227/323; H01L 2251/308
See application file for complete search history.

(56) References Cited

U.S. PATENT DOCUMENTS

| | | |
|---|---|---|
| 2014/0284591 A1 | 9/2014 | Ono et al. |
| 2016/0093680 A1* | 3/2016 | Paek .................... H01L 27/3279 257/40 |
| 2017/0170431 A1* | 6/2017 | Im ........................ H01L 27/3262 |
| 2019/0165085 A1 | 5/2019 | Choi et al. |

FOREIGN PATENT DOCUMENTS

| | | |
|---|---|---|
| CN | 110048022 A | 7/2019 |
| EP | 1808898 A2 | 7/2007 |

\* cited by examiner

ORGANIC LIGHT EMITTING DIODE PANEL AND METHOD FOR FABRICATING SAME

FIELD OF INVENTION

The present invention relates to a display technology, and more particularly to an organic light emitting diode panel and a method for fabricating the same.

BACKGROUND

Organic light emitting diodes (OLEDs) belong to a type of current-type semiconductor light emitting devices. By controlling injection and combination of carriers, organic materials are excited to emit light and display. It belongs to an autonomous light emitting technology.

The display principle of an active-matrix organic light emitting diode (AMOLED) is to control the current on an OLED to change the brightness of its light emission by controlling the switching state of the thin film transistor (TFT) of each sub-pixel to achieve the display. Therefore, OLEDs are very sensitive to their driving current, and a small current change will affect their luminous intensity.

For large-size AMOLED displays, a top-emitting panel structure can be used to fully increase the resolution of the panel. In the top-emitting structure of an AMOLED, the emitted light needs to pass through the cathode of an OLED device, so the cathode should have sufficient transparency. Therefore, the metal cathode material in a top-emitting OLED device should be as thin as possible, but the reduction in the thickness of the metal cathode will greatly increase the resistance of the metal cathode. When a large-sized panel is in operation, the current flowing through the high-resistance metal cathode will cause IR drops at the center of the panel and its surroundings. This further causes a difference in the current on the OLED device at different positions of the large-sized panel, which in turn will cause the brightness difference between the center and the surrounding area and also cause uneven light emission of the panel and affects the display quality. Therefore, it is necessary to provide an OLED panel to solve the aforementioned problems.

SUMMARY

In the top-emitting structure of an AMOLED, the emitted light needs to pass through the cathode of an OLED device, so the cathode should have sufficient transparency. Therefore, the metal cathode material in a top-emitting OLED device should be as thin as possible, but the reduction in the thickness of the metal cathode will greatly increase the resistance of the metal cathode. When a large-sized panel is in operation, the current flowing through the high-resistance metal cathode will cause IR drops at the center of the panel and its surroundings. This further causes a difference in the current on the OLED device at different positions of the large-sized panel, which in turn will cause the brightness difference between the center and the surrounding area and also cause uneven light emission of the panel and affects the display quality.

In view of this, an organic light emitting diode panel and a method for fabricating the same are provided in order to solve uneven light emission and the effect of display quality due to the difference in brightness between the center and the surroundings of a large-sized OLED panel resulting from the pressure drop (IR Drop) in the center and surroundings of an organic light emitting diode (OLED) panel existing in the prior art.

To achieve the foregoing object of the present invention, an embodiment of the present invention provides an organic light emitting diode panel comprising a substrate, a pixel defining layer disposed over a portion of the substrate, an organic light emitting diode device and an auxiliary cathode contacting device disposed over the substrate divided by the pixel defining layer, and a transparent electrode layer. The organic light emitting diode device comprises an anode layer, a hole injecting layer, a hole transporting layer, a light emitting layer, and an electron transporting layer sequentially formed over a portion of the substrate. In addition, the auxiliary cathode contacting device comprises an auxiliary cathode and a conductive contact sequentially formed over another portion of the substrate, and the conductive contact comprises a conductive mixture composed of the electron transporting layer and a solvent material used to dissolve the electron transporting layer. The transparent electrode layer covers the electron transporting layer, the pixel defining layer, and the conductive contact.

In one embodiment, the transparent electrode layer comprises a material of indium tin oxide or indium zinc oxide.

In one embodiment, the electron transporting layer comprises a material of 4,7-diphenyl-1, 10-phenanthroline, 8-hydroxyquinolinolato-lithium, or 1,3,5-Tris(1-phenyl-1H-benzimidazol-2-yl) benzene, and the solvent material used for dissolving the electron transporting layer is composed of 1,10-o-phenanthroline, 4-oxo-4,5,6,7-tetrahydro-1 benzofuran-3-carboxylic acid methyl ester, or 1-phenyl-1H-benzimidazole, respectively.

In one embodiment, the solvent material is in a solid state at a temperature of less than 80° C., and in a liquid state at a temperature higher than 80° C.

In one embodiment, the transparent electrode layer and the auxiliary cathode form an ohmic contact through the conductive contact.

Moreover, another embodiment of the present invention provides a method for fabricating an organic light emitting diode panel, comprising the following steps of providing a substrate, forming an anode layer and an auxiliary cathode over portions of the substrate, forming a pixel defining layer over the substrate to separate the anode layer from the auxiliary cathode, sequentially forming a hole injecting layer, a hole transporting layer, and a light emitting layer over the anode layer, forming a solid solvent layer over the auxiliary cathode, wherein the solid solvent layer is in a solid state at a temperature less than 80° C., forming an electron transporting layer and a transparent electrode layer, wherein the electron transporting layer and the transparent electrode layer covers the light emitting layer and the solid solvent layer, and performing a heating process. In the heating process, the solid solvent layer is converted into a liquid state at a temperature higher than 80° C. to dissolve and mix with the electron transporting layer thereabove, and a conductive contact comprising a conductive mixture composed of the electron transporting layer and a solvent material of the solvent layer is formed between the electrode and the auxiliary cathode after the temperature is reduced to less than 80° C.

In one embodiment, the transparent electrode layer comprises a material of indium tin oxide or indium zinc oxide.

In one embodiment, the electron transporting layer comprises a material of 4,7-diphenyl-1,10-phenanthroline, 8-hydroxyquinolinolato-lithium, or 1,3,5-Tris(1-phenyl-1H-benzimidazol-2-yl) benzene, and the solvent material used for dissolving the electron transporting layer comprises a material of 1,10-o-phenanthroline, 4-oxo-4,5,6,7-tetrahydro-1-benzofuran-3-carboxylic acid methyl ester, or 1-phenyl-1H-benzimidazole, respectively.

In one embodiment, the solid solvent layer is formed by an inkjet printing process.

In one embodiment, the transparent electrode layer and the auxiliary cathode form an ohmic contact through the conductive contact.

Compared with the prior art, in the organic light emitting diode panel and the method for fabricating the same of the present invention, voltage drops at the center and the surroundings of the panel can be effectively reduced by disposing an auxiliary cathode contact device while reducing a thickness of the cathode. In addition, by forming the conductive contacts in the auxiliary cathode contact device with a conductive mixture containing an electron transporting layer and a material of a solid solvent layer, the auxiliary cathode and the cathode can achieve ohmic contact therebetween. This can further reduce the resistance of the auxiliary cathode contact and the voltage drop of the cathode of a large-area high-resolution top-emitting panel, and improve the brightness uniformity and display quality of the large-sized panel, thereby enhancing the competitiveness of the product.

In order to make the above content of the present invention more comprehensible, the following describes the preferred embodiments in detail with the accompanying drawings as follows:

BRIEF DESCRIPTION OF DRAWINGS

To explain the technical schemes of the embodiments or existing techniques in detail, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
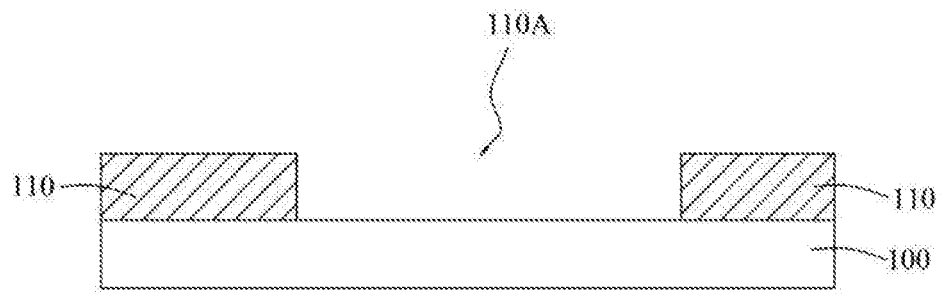
FIG. 1 to FIG. 8 are schematic cross-sectional views of a method for fabricating an organic light emitting diode panel according to an embodiment of the present invention.

Please refer to the drawings in the drawings, in which the same reference numerals represent the same components. The following description is based on the specific embodiments of the present invention as illustrated and should not be construed as limiting the specific embodiments that are not described herein. The directional terms mentioned in the present invention, such as "upper", "lower", "before", "after", "left", "right", "inside", "outside", "side", etc., are only used to show direction in the figures. The directional terms used in the drawings are used to explain and explain the invention and are not intended to limit the scope of the invention.

FIG. 1 to FIG. 8 are schematic cross-sectional views of a method for fabricating an organic light emitting diode panel according to an embodiment of the present invention.

Referring to FIG. 1, a substrate 100 is provided, and two metal traces 110 are separately formed over the substrate 100. The two metal traces 110 are separated by an opening 110A. Specifically, the substrate 100 is a glass substrate, and other elements (not shown) such as a thin film transistor (TFT) may be disposed thereover. The left metal trace 110 in FIG. 1 is used to electrically connect pixels (not shown), and the right metal trace 110 is used to electrically connect auxiliary circuits (not shown). The metal traces 110 are about 10-30 microns apart by the opening 110A, so they are not electrically connected to each other.

Figure 2:
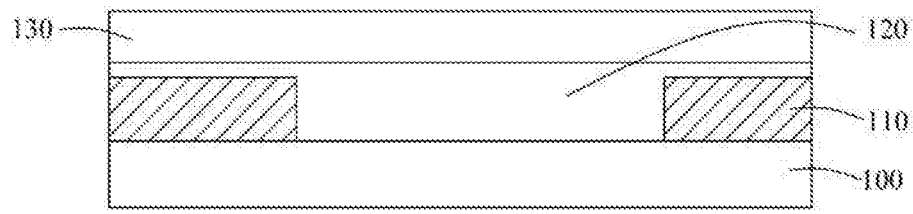

Referring to FIG. 2, a passivation layer 120 is formed over the substrate 100, the metal traces 110, and the opening 110A. The passivation layer 120 covers the surface of the metal traces 110 and fills the opening 110A therebetween. The passivation layer 120 comprises an inorganic insulating layer, an organic insulating layer, or a composite stacked film layer thereof. A planarization layer 130 is then formed over the passivation layer 120. The planarization layer 130 comprises an organic material, an inorganic material, or a mixed material of organic and inorganic materials. Specifically, the planarization layer 130 is a plurality of layers of the same material or different materials. Specifically, the planarization layer 130 comprises a siloxane or a metal oxide. The metal oxide can be, for example, MgO, $Al_2O_3$, $ZrO_2$, $SnO_2$, ZnO, $SiO_2$, or $TiO_2$, or a combination of the above metal oxides.

Figure 3:
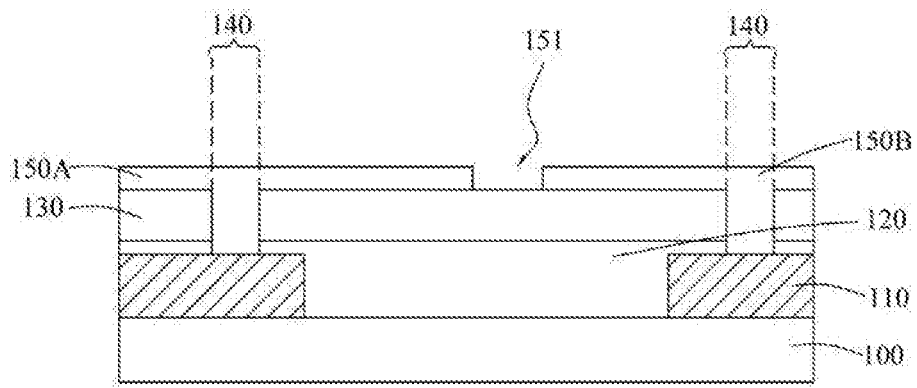

Referring to FIG. 3, two openings 140 sequentially penetrating the planarization layer 130 and the passivation layer 120 are formed. Each opening 140 exposes a portion of each metal trace 110. Specifically, the openings 140 may be formed by processes such as photolithography and etching. Next, a first conductive layer is formed over the planarization layer 130 and fills the openings 140, and the first conductive layer is physically connected to the metal traces 110. Next, an opening 151 is formed in the first conductive layer, and the opening 151 is located between the openings 140, exposes a portion of the planarization layer 130 below, and divides the first conductive layer into separated first portion 150A and second portion 150B. Specifically, the first portion 150A of the first conductive layer is physically connected to the left metal trace 110 to serve as an anode of an organic light emitting diode. The second portion 150B of the first conductive layer is physically connected to the right metal trace 110 as a cathode contact. Specifically, the opening 151 may be formed by processes such as photolithography and etching. Specifically, a material of the first conductive layer can be a conductive material such as indium tin oxide (ITO) or indium zinc oxide (IZO).

Figure 4:
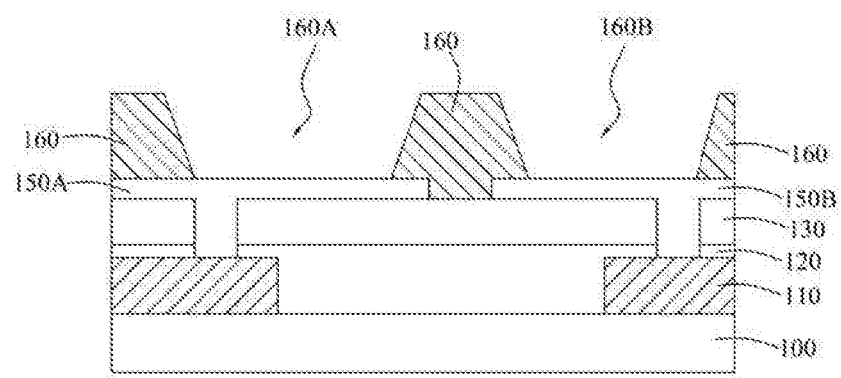

Referring to FIG. 4, a pixel defining layer 160 is formed over the first conductive layer. The pixel defining layer 160 forms a pixel opening 160A over the first portion 150A (anode layer) of the first conductive layer, and forms a cathode contact hole 160B over the second portion 150B (auxiliary cathode) of the first conductive layer. Specifically, the second portion 150B (auxiliary cathode) of the first conductive layer is separated from the first portion 150A (anode layer) of the first conductive layer by the pixel defining layer 160 partially disposed in the opening 151 (see FIG. 3).

Figure 5:
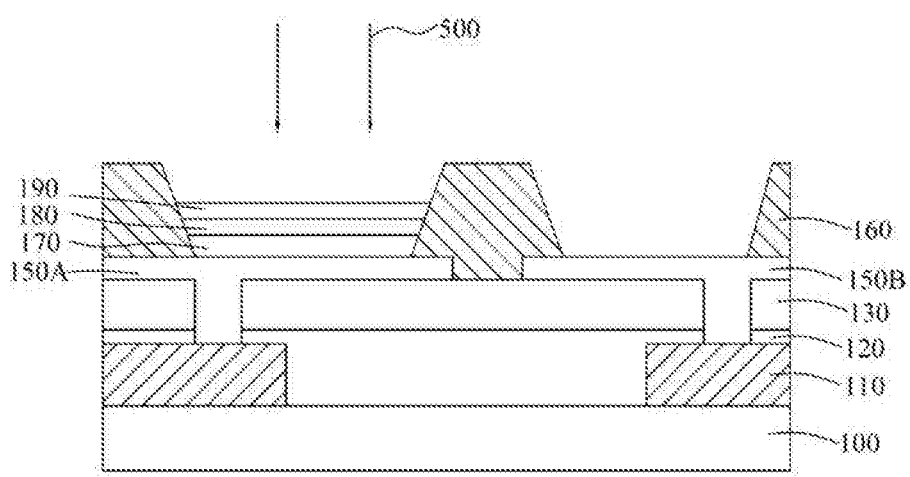

Referring to FIG. 5, a hole injecting layer (HIL) 170, a hole transporting layer (HTL) 180, and a light emitting layer (EML) 190 are formed in the pixel opening 160A over the first portion 150A (anode layer) of the first conductive layer from bottom to top through performing the process 500.

Specifically, the process 500 for fabricating the hole injecting layer 170, the hole transporting layer 180, and the light emitting layer 190 may be several times of inkjet printing process, which is represented only by the process 500 here. Suitable materials may be used for the hole injecting layer 170, the hole transporting layer 180, and the light emitting layer 190. Specifically, the hole injecting layer 170 may comprise a material that is convenient for controlling the hole injecting speed, such as CuPc. The hole transporting layer 180 may comprise a material having high thermal stability and is favorable for hole transporting such as NPB (N, N'-(1-naphthyl)-N, N'diphenyl-4,4'biphenyl Diamine) and the like. The light emitting layer 190 may be a material with high light emitting efficiency such as Alq3.

Figure 6:
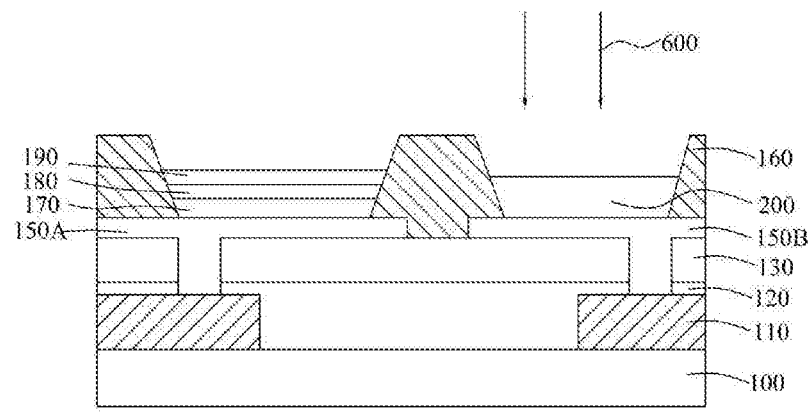

Referring to FIG. 6, a solid solvent layer 200 is formed in a cathode contact hole 160B over the second portion 150B (auxiliary cathode) of the first conductive layer through performing the process 600.

Specifically, the process 600 for fabricating the solid solvent layer 200 can be an inkjet printing process. The solid solvent layer 200 is a suitable solvent material that is in a solid state at normal temperature (25° C.) and is in a liquid state after heated to a temperature above the normal temperature to dissolve the subsequently formed electron transporting layer. The suitable solvent material is a material such as 1,10-o-phenanthroline, 4-oxo-4,5,6,7-tetrahydro-1-benzofuran-3-carboxylic acid methyl ester, or 1-phenyl-1H-benzimidazole. The material of the solid solvent layer 200 may be non-conductive or conductive, or may be a single component or a mixture. Since the solid solvent layer 200 is solid at normal temperature, the inkjet print head used in the inkjet printing process of the process 600 is a heated printing head, and the material of the solid solvent layer 200 that is in a solid state at normal temperature is heated to a liquid state and printed on the solid solvent layer 200 formed in the cathode contact hole 160B, and the solid solvent layer 200 formed in the cathode contact hole 160B will become a solid state after cooling down to a room temperature.

Figure 7:
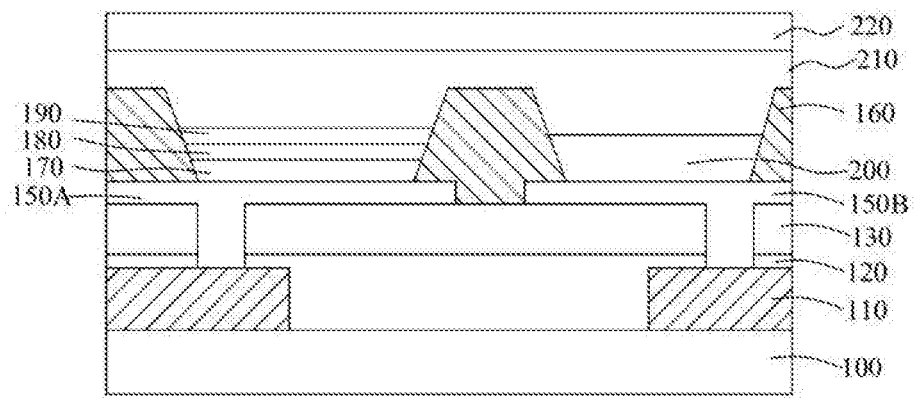

Referring to FIG. 7, an electron transporting layer (ETL) 210 and a transparent electrode 220 are formed next. The electron transporting layer 210 fills the pixel opening 160A and the remaining space of the cathode contact hole 160B, extending from the pixel opening 160A into the cathode contact hole 160B and covering the pixel defining layer 160 to contact the solid solvent layer 200. The transparent electrode layer 220 is formed over the electron transporting layer 210 to serve as a cathode.

The electron transporting layer 210 is formed by a vapor deposited material fabricated by a vapor deposition method. The transparent electrode layer 220 is also formed by a vapor deposited material fabricated by a vapor deposition method. Specifically, the electron transporting layer 210 may be a material having high thermal stability and favorable for electron transporting such as 4,7-diphenyl-1,10-phenanthroline, 8-hydroxyquinolinolato-lithium, or 1,3,5-Tris(1-phenyl-1H-benzimidazol-2-yl) benzene etc., which can be dissolved by the aforementioned 1,10-o-phenanthroline, 4-oxo-4,5,6,7-tetrahydro-1-benzofuran-3-carboxylic acid methyl ester, or 1-phenyl-1H-benzimidazole, respectively, thereby mixing the solvent material with dissolved conductive particles of the electron transporting layer 210 into a conductive mixture. The transparent electrode layer 220 may comprise a transparent conductive material such as indium tin oxide (ITO) or indium zinc oxide (IZO).

Figure 8:
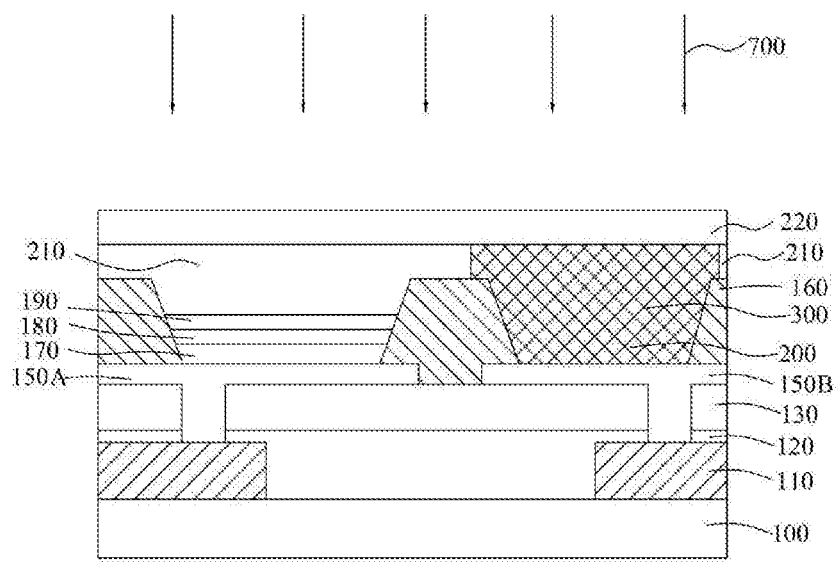

Please refer to FIG. 8, and the heating process 700 is next performed to the OLED panel shown in FIG. 7, that is, the OLED panel shown in FIG. 7 is heated to a temperature higher than normal temperature. For example, the melting point (greater than 80° C.) causes the solid solvent layer 200 in a solid state at normal temperature to transform thereof into a liquid state, and then dissolves and mixes with the electron transporting layer 210 formed thereover. Then, the OLED panel is cooled down to the room temperature, so that the electron transporting layer 210 and the solvent layer 200 for dissolving the electron transporting layer 210 are cured into a conductive contact 300 made of a conductive mixture comprising the electron transporting layer 210 and the solvent material of the solid solvent layer 200 for dissolving the electron transporting layer 210. The conductive contact 300 of the conductive mixture enables electrical conduction between the transparent electrode layer (cathode) 220 and the second portion 150B (auxiliary cathode) of the first conductive layer through the conductive contact 300.

As shown in FIG. 8, the present invention provides an OLED panel, which is a top-emitting organic light emitting diode display panel, comprising an OLED device and an auxiliary cathode disposed over a substrate and spaced apart by a pixel defining layer 160. The OLED device comprises a first portion 150A (anode layer) of a first conductive layer, a hole injecting layer 170, a hole transporting layer 180, and a light emitting layer 190, an electron transporting layer 210, and a transparent electrode layer 220 sequentially formed over the first portion 150A (anode layer) of the first conductive layer. The auxiliary cathode contact device comprises a second portion 150B (auxiliary cathode) of the first conductive layer, conductive contacts 300, and a transparent electrode layer 220 formed on the second portion 150B (auxiliary cathode) of the first conductive layer in this order. The conductive contact 300 comprises a conductive mixture composed of an electron transporting layer 210 and a solid solvent layer 200 material used to dissolve the electron transporting layer. The electron transporting layer of the OLED device and the conductive contact 300 of the auxiliary cathode contact device are electrically conducted through the transparent electrode layer 220.

In addition, in the method for fabricating the OLED panel of the present invention, the second portion 150B (auxiliary cathode) of the first conductive layer spaced from the transparent electrode layer (cathode) 220 is provided over the substrate 100 corresponding to the pixel defining layer 160. A cathode contact opening 160B is provided above the second portion 150B (auxiliary cathode) of the first conductive layer. During the fabrication process, the electron transporting layer 210 extends from the pixel opening 160A into the cathode contact hole 160B to separate the transparent electrode layer (cathode) 220 and the second portion 150B (auxiliary cathode) of the first conductive layer. In order to electrically conduct the transparent electrode layer (cathode) 220 and the second portion 150B (auxiliary cathode) of the first conductive layer, the heating process 700 is performed to the OLED panel, so that the solid solvent layer 200 dissolves the material of the electron transporting layer 210 above it and then cools down to form a conductive material comprising the electron transporting layer 210 and the solid solvent layer 200 for dissolving the electron transporting layer 210. The conductive contact 300 made of the conductive mixture is used to achieve electrical conduction between the transparent electrode layer (cathode) 220 and the second portion 150B (the auxiliary cathode) of the first conductive layer. The fabricated OLED device is applied to an OLED display panel and during operation, a positive voltage can be applied to the first portion 150A (anode layer) of the first conductive layer, the transparent electrode layer (cathode) 220 and the second portion of the first conductive layer The same negative voltage is applied to 150B (auxiliary cathode). The second 150B (auxiliary cathode) of the first conductive layer can directly provide voltage and current compensation to the transparent electrode layer (cathode) 220. The second portion 150B (auxiliary cathode), each provided with a first conductive layer, and the transparent electrode layer (cathode) 220 are electrically connected, thereby preventing uneven brightness caused by a voltage drop (IR drop) in a large-area OLED display panel.

In the organic light emitting diode panel and the method for fabricating the same of the present invention, voltage drops at the center and the surroundings of the panel can be effectively reduced by disposing an auxiliary cathode contact device while reducing a thickness of the cathode. In addition, by forming the conductive contacts 300 in the auxiliary cathode contact device with a conductive mixture containing an electron transporting layer 210 and a material of a solid solvent layer 200, the second portion 150B (the auxiliary cathode) of the first conductive layer and the transparent electrode 220 (the cathode) can achieve ohmic contact therebetween. This can further reduce the resistance of the auxiliary cathode contact and the voltage drop of the cathode of a large-area high-resolution top-emitting panel, and improve the brightness uniformity and display quality of the large-sized panel, thereby enhancing the competitiveness of the product.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. An organic light emitting diode panel, comprising:
a substrate;
a pixel defining layer disposed over a portion of the substrate;
an organic light emitting diode device and an auxiliary cathode contacting device disposed over the substrate, which are divided by the pixel defining layer, wherein the organic light emitting diode device comprises an anode layer, a hole injecting layer, a hole transporting layer, a light emitting layer, and an electron transporting layer sequentially formed over the portion of the substrate, and the auxiliary cathode contacting device comprises an auxiliary cathode and a conductive contact sequentially formed over another portion of the substrate, wherein the conductive contact comprises a conductive mixture consisting of the electron transporting layer and a solvent material used to dissolve the electron transporting layer; and
a transparent electrode layer, covering the electron transporting layer, the pixel defining layer, and the conductive contact,
wherein a material of the electron transporting layer is composed of 4,7-diphenyl-1,10-phenanthroline, 8-hydroxyquinolinolato-lithium, or 1,3,5-Tris(1-phenyl-1H-benzimidazol-2-yl) benzene, and a material of the solvent material used for dissolving the electron transporting layer is 1,10-o-phenanthroline, 4-oxo-4,5,6,7-tetrahydro-1-benzofuran-3-carboxylic acid methyl ester, or 1-phenyl-1H-benzimidazole.

2. The organic light emitting diode panel according to claim 1, wherein a material of the transparent electrode layer consists of indium tin oxide or indium zinc oxide.

3. The organic light emitting diode panel according to claim 1, wherein the solvent material is in a solid state at a temperature of less than 80° C., and in a liquid state at a temperature higher than 80° C.

4. The organic light emitting diode panel according to claim 1, wherein the transparent electrode layer and the auxiliary cathode form an ohmic contact through the conductive contact.

5. A method for fabricating an organic light emitting diode panel, comprising following steps:
providing a substrate;
forming an anode layer and an auxiliary cathode over portions of the substrate;
forming a pixel defining layer over the substrate to separate the anode layer from the auxiliary cathode;
sequentially forming a hole injecting layer, a hole transporting layer, and a light emitting layer over the anode layer;
forming a solid solvent layer over the auxiliary cathode, wherein the solid solvent layer is in a solid state at a temperature less than 80° C.;
forming an electron transporting layer and a transparent electrode layer, wherein the electron transporting layer and the transparent electrode layer cover the light emitting layer and the solid solvent layer; and
performing a heating process, converting the solid solvent layer to a liquid state at a temperature higher than 80° C. to dissolve and mix with the electron transporting layer thereabove, and forming a conductive contact comprising a conductive mixture consisting of the electron transporting layer and a solvent material of the solid solvent layer between the electrode and the auxiliary cathode as the temperature is reduced to less than 80° C.

6. The method according to claim 5, wherein a material of the transparent electrode layer consists of indium tin oxide or indium zinc oxide.

7. The method according to claim 5, wherein the electron transporting layer comprises a material of the electron transporting layer is composed of 4,7-diphenyl-1,10-phenanthroline, 8-hydroxyquinolinolato-lithium, or 1,3,5-Tris(1-phenyl-1H-benzimidazol-2-yl) benzene, and a material of the solvent material used for dissolving the electron transporting layer is 1,10-o-phenanthroline, 4-oxo-4,5,6,7-tetrahydro-1-benzofuran-3-carboxylic acid methyl ester, or 1-phenyl-1H-benzimidazole.

8. The method according to claim 5, wherein the solid solvent layer is formed by an inkjet printing process.

9. The method according to claim 8, wherein the transparent electrode layer and the auxiliary cathode form an ohmic contact through the conductive contact.

* * * * *